United States Patent
Saito et al.

(10) Patent No.: US 12,313,460 B2
(45) Date of Patent: May 27, 2025

(54) DETECTION DEVICE COMPRISING PHOTODIODES WITH STACKED ORGANIC SEMICONDUCTOR LAYERS

(71) Applicants: Japan Display Inc., Tokyo (JP); The University of Tokyo, Tokyo (JP)

(72) Inventors: Keiichi Saito, Tokyo (JP); Takashi Nakamura, Tokyo (JP); Gen Koide, Tokyo (JP); Takao Someya, Tokyo (JP); Tomoyuki Yokota, Tokyo (JP)

(73) Assignees: Japan Display Inc., Tokyo (JP); The University of Tokyo, Tokyo (JP)

( * ) Notice: Subject to any disclaimer, the term of this patent is extended or adjusted under 35 U.S.C. 154(b) by 0 days.

(21) Appl. No.: 18/742,015

(22) Filed: Jun. 13, 2024

(65) Prior Publication Data

US 2024/0337530 A1    Oct. 10, 2024

Related U.S. Application Data

(63) Continuation of application No. PCT/JP2022/045233, filed on Dec. 8, 2022.

(30) Foreign Application Priority Data

Dec. 15, 2021  (JP) .................................. 2021-203373

(51) Int. Cl.
*G01J 1/44* (2006.01)
*H10K 39/32* (2023.01)

(52) U.S. Cl.
CPC ................ *G01J 1/44* (2013.01); *H10K 39/32* (2023.02); *G01J 2001/446* (2013.01)

(58) Field of Classification Search
CPC ....... G01J 1/44; G01J 2001/446; H10K 39/32
See application file for complete search history.

(56) References Cited

U.S. PATENT DOCUMENTS

| 4,677,289 A | * | 6/1987 | Nozaki ................... H01L 31/06 |
| | | | 250/208.2 |
| 5,243,177 A | | 9/1993 | Fujimagari et al. |

(Continued)

FOREIGN PATENT DOCUMENTS

| JP | H05022516 A | 1/1993 |
| JP | 2019160826 A | 9/2019 |

(Continued)

OTHER PUBLICATIONS

International Search Report from corresponding PCT application PCT/JP2022/045233, dated Mar. 7, 2023.

*Primary Examiner* — Jennifer D Bennett
(74) *Attorney, Agent, or Firm* — K&L Gates LLP

(57) ABSTRACT

According to an aspect, a detection device includes: a first detection circuit including a first photodiode sensitive to first light and a second photodiode sensitive to second light; and a second detection circuit including a third photodiode sensitive to third light. The first photodiode and the second photodiode are coupled in series and in opposite directions to form a first detection element. One end side of the first detection element is coupled to a first signal line via a first transistor. Another end side of the first detection element is configured to be supplied with a first drive signal. A cathode of the third photodiode is coupled to a second signal line via a second transistor. An anode of the third photodiode is configured to be supplied with a second drive signal.

6 Claims, 8 Drawing Sheets

(56) References Cited

U.S. PATENT DOCUMENTS

| | | | |
|---|---|---|---|
| 2008/0157249 A1* | 7/2008 | Hwang | H01L 27/14645 |
| | | | 438/69 |
| 2008/0191298 A1* | 8/2008 | Lin | H01L 27/14647 |
| | | | 257/E21.705 |
| 2015/0129747 A1* | 5/2015 | Petilli | H01L 27/14627 |
| | | | 257/432 |
| 2020/0400491 A1 | 12/2020 | Tanaka et al. | |
| 2021/0118954 A1 | 4/2021 | Bailly et al. | |
| 2021/0326623 A1 | 10/2021 | Kato et al. | |

FOREIGN PATENT DOCUMENTS

| | | |
|---|---|---|
| JP | 2020518132 A | 6/2020 |
| WO | 2020/137129 A1 | 7/2020 |

* cited by examiner

DETECTION DEVICE COMPRISING PHOTODIODES WITH STACKED ORGANIC SEMICONDUCTOR LAYERS

CROSS-REFERENCE TO RELATED APPLICATION

This application claims the benefit of priority from Japanese Patent Application No. 2021-203373 filed on Dec. 15, 2021 and International Patent Application No. PCT/JP2022/045233 filed on Dec. 8, 2022, the entire contents of which are incorporated herein by reference.

BACKGROUND

1. Technical Field

What is disclosed herein relates to a detection device.

2. Description of the Related Art

Organic photodiodes (OPDs) using organic semiconductor materials are known as optical sensors (for example, Japanese Patent Application Laid-open Publication No. 2019-160826).

It is difficult to develop color scanners having sensitivity to different wavelengths using the OPDs.

For the foregoing reasons, there is a need for a detection device with OPDs that has high detection sensitivity to different wavelengths.

SUMMARY

According to an aspect, a detection device includes: a first detection circuit including a first photodiode sensitive to first light and a second photodiode sensitive to second light; and a second detection circuit including a third photodiode sensitive to third light. The first photodiode and the second photodiode are coupled in series and in opposite directions to form a first detection element. One end side of the first detection element is coupled to a first signal line via a first transistor. Another end side of the first detection element is configured to be supplied with a first drive signal. A cathode of the third photodiode is coupled to a second signal line via a second transistor. An anode of the third photodiode is configured to be supplied with a second drive signal.

DETAILED DESCRIPTION

Figure 1:
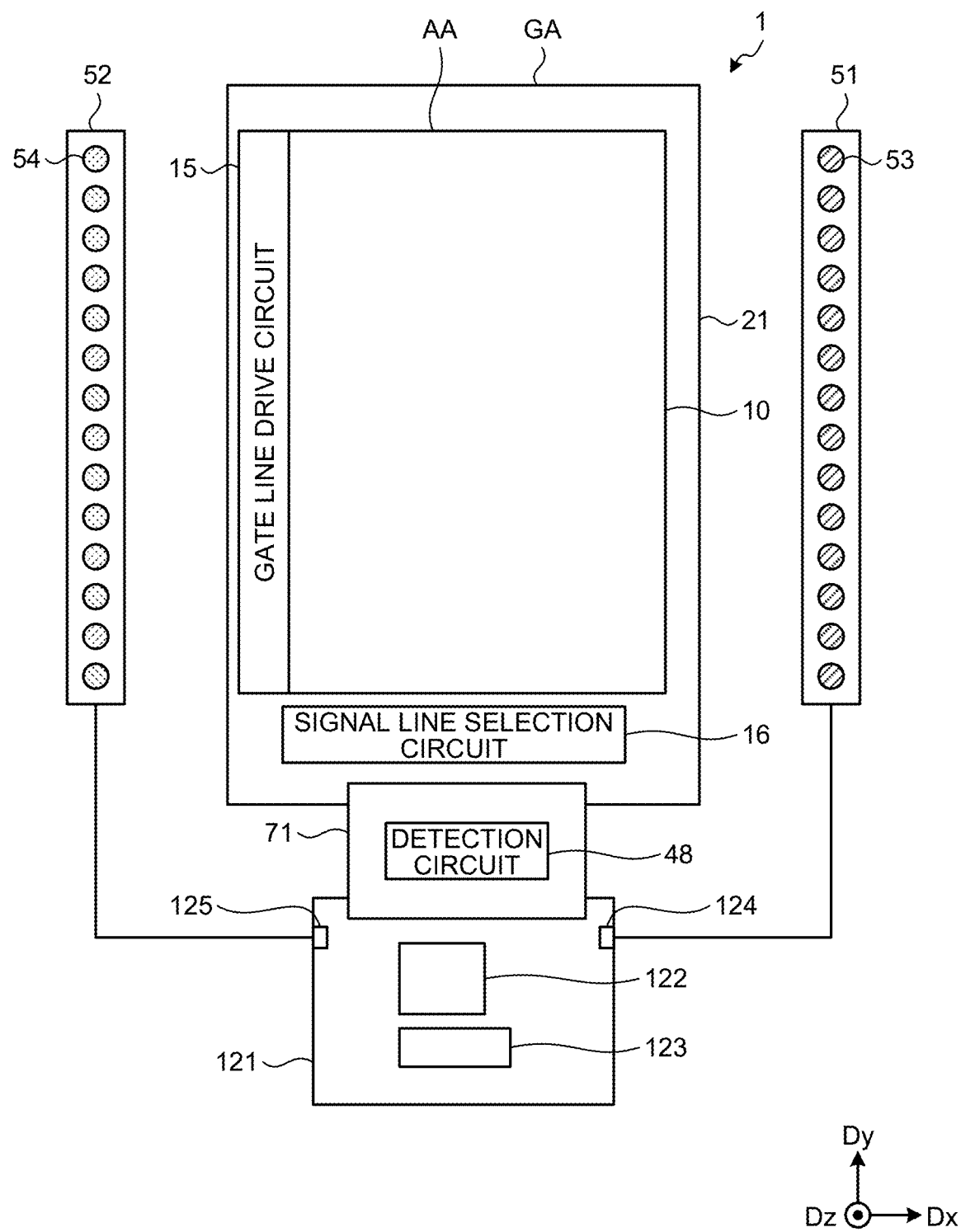
FIG. 1 is a plan view illustrating a detection device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a plan view illustrating a detection device according to a first embodiment. A detection device 1 of the present embodiment includes an organic photodiode (OPD) as an optical sensor and is employed in color scanners and digital cameras that capture images of objects to be detected. As illustrated in FIG. 1, the detection device 1 includes a substrate 21, a sensor 10, a gate line drive circuit 15, a signal line selection circuit 16, a detection circuit 48, a control circuit 122, a power supply circuit 123, a first light source base member 51, a second light source base member 52, a first light source 53, and a second light source 54. The first light source base member 51 is provided with a plurality of the first light sources 53. The second light source base member 52 is provided with a plurality of the second light sources 54.

The substrate 21 is electrically coupled to a control substrate 121 through a wiring substrate 71. The wiring substrate 71 is, for example, a flexible printed circuit board or a rigid circuit board. The wiring substrate 71 is provided with the detection circuit 48. The control substrate 121 is provided with the control circuit 122 and the power supply circuit 123. The control circuit 122 is a field-programmable gate array (FPGA), for example. The control circuit 122 supplies control signals to the sensor 10, the gate line drive circuit 15, and the signal line selection circuit 16 to control detection operations of the sensor 10. The control circuit 122 supplies control signals to the first and the second light sources 53 and 54 to control lighting and non-lighting of the first and the second light sources 53 and 54. The power supply circuit 123 supplies voltage signals including, for example, a sensor power supply signal (drive signal or power supply voltage) VDDSNS (refer to FIG. 4) to the sensor 10, the gate line drive circuit 15, and the signal line selection circuit 16. The power supply circuit 123 supplies a power supply voltage to the first and the second light sources 53 and 54.

The substrate 21 has a detection area AA and a peripheral area GA. The detection area AA is an area provided with a plurality of photodiodes PD (refer to FIG. 4) included in the sensor 10. The peripheral area GA is an area between the outer perimeter of the detection area AA and the outer edges of the substrate 21 and is an area not provided with the photodiodes PD.

The gate line drive circuit 15 and the signal line selection circuit 16 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA and is provided between the sensor 10 and the detection circuit 48.

In the following description, the first direction Dx is a direction in a plane parallel to the substrate 21. The second direction Dy is a direction in the plane parallel to the substrate 21, and is a direction orthogonal to the first direction Dx. The second direction Dy may non-orthogonally intersect the first direction Dx. The term "plan view" refers to a positional relation when viewed in a direction orthogonal to the substrate 21.

The first light sources 53 are provided on the first light source base member 51, and arranged along the second direction Dy. The second light sources 54 are provided on the second light source base member 52, and arranged along the second direction Dy. The first light source base member 51 and the second light source base member 52 are electrically coupled, through respective terminals 124 and 125, provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the first and the second light sources 53 and 54. Each of the first and the second light sources 53 and 54 includes a plurality of LEDS that emit light in red (R), light in green (G), and light in blue (B). The first and the second light sources 53 and 54 may include a plurality of LEDs that emit light in white. The light emitted from the first and the second light sources 53 and 54 is reflected by a surface of an object to be detected and enters the sensor 10. As a result, the sensor 10 can image the object to be detected. The first and the second light sources 53 and 54 may be excluded.

Figure 2:
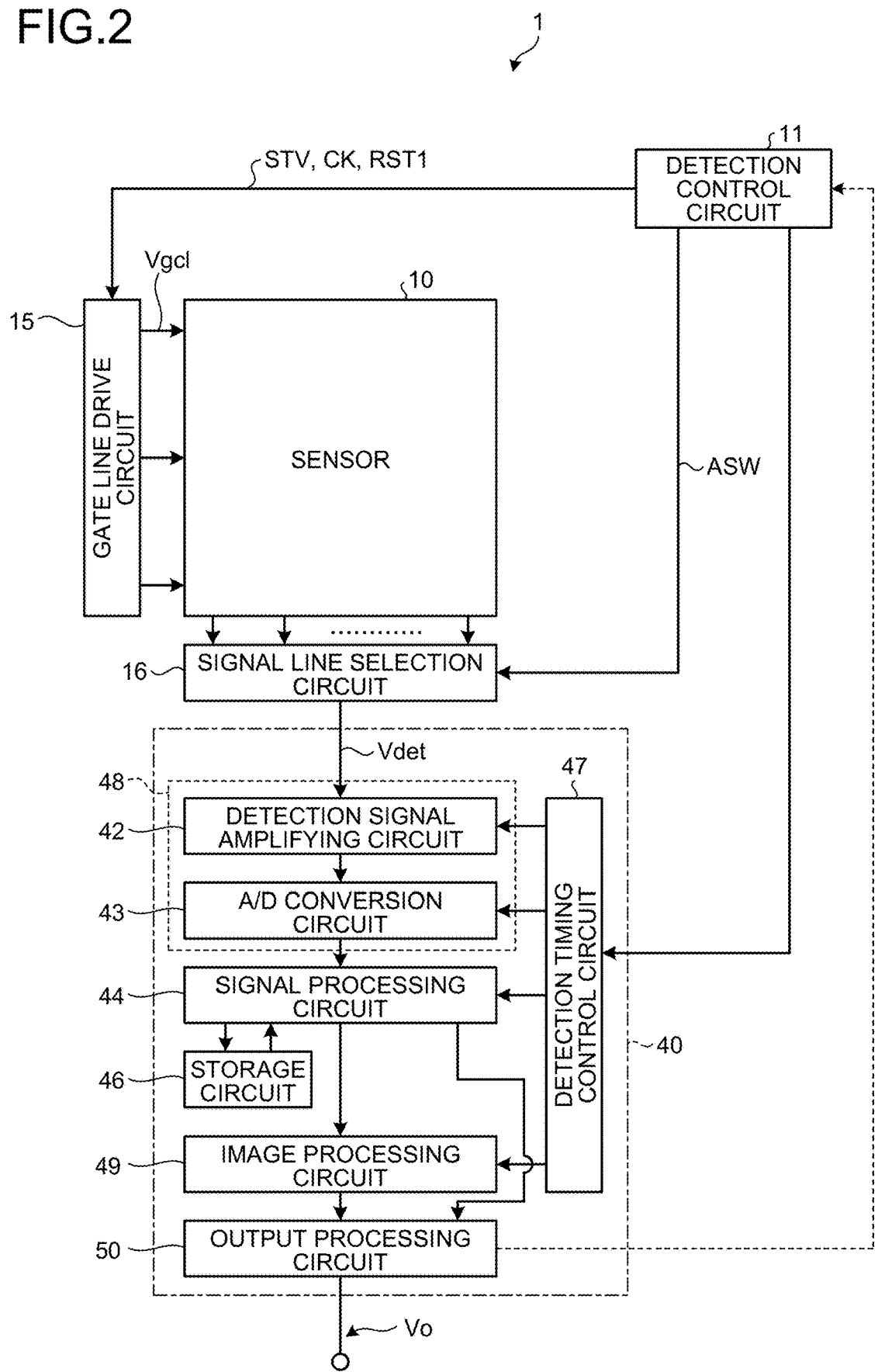
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection control circuit 11 and a detector (detection signal processing circuit) 40. The control circuit 122 includes one, some, or all functions of the detection control circuit 11. The control circuit 122 also includes one, some, or all functions of the detector 40 other than those of the detection circuit 48.

The sensor 10 includes the photodiodes PD. Each of the photodiodes PD included in the sensor 10 outputs an electrical signal corresponding to light irradiating the photodiode PD as an output signal Vdet to the signal line selection circuit 16. The sensor 10 performs the detection in response to a gate drive signal Vgcl supplied from the gate line drive circuit 15.

The detection control circuit 11 is a circuit that supplies respective control signals to the gate line drive circuit 15, the signal line selection circuit 16, and the detector 40 to control operations of these components. The detection control circuit 11 supplies various control signals such as a start signal STV, a clock signal CK, and a reset signal RST1 to the gate line drive circuit 15. The detection control circuit 11 also supplies various control signals such as a selection signal ASW to the signal line selection circuit 16. The detection control circuit 11 also supplies various control signals to the first and the second light sources 53 and 54 to control the lighting and non-lighting of the respective first and second light sources 53 and 54.

The gate line drive circuit 15 is a circuit that drives a plurality of gate lines GCL (refer to FIG. 3) based on the various control signals. The gate line drive circuit 15 sequentially or simultaneously selects the gate lines GCL and supplies the gate drive signals Vgcl to the selected gate lines GCL. By this operation, the gate line drive circuit 15 selects the photodiodes PD coupled to the gate lines GCL.

Figure 3:
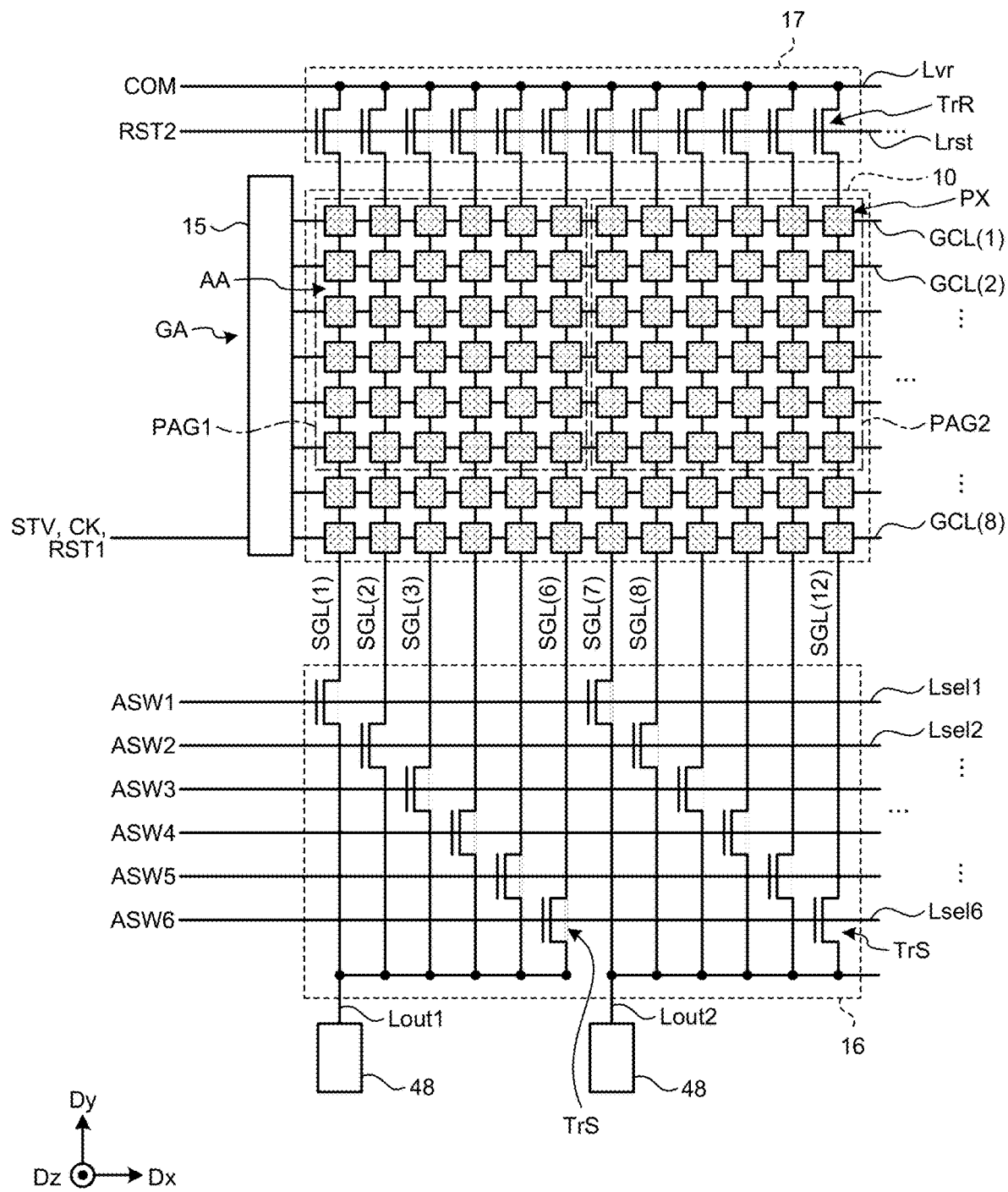
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is a multiplexer, for example. The signal line selection circuit 16 couples the selected signal lines SGL to the detection circuit 48 based on the selection signal ASW supplied from the detection control circuit 11. By this operation, the signal line selection circuit 16 outputs the output signals Vdet of the photodiodes PD to the detector 40.

The detector 40 includes the detection circuit 48, a signal processing circuit 44, a storage circuit 46, a detection timing control circuit 47, an image processing circuit 49, and an output processing circuit 50. The detection timing control circuit 47 controls the detection circuit 48, the signal processing circuit 44, and the image processing circuit 49 so as to operate in synchronization with one another based on a control signal supplied from the detection control circuit 11.

The detection circuit 48 is an analog front-end (AFE) circuit, for example. The detection circuit 48 is a signal processing circuit having functions of at least a detection signal amplifying circuit 42 and an analog-to-digital (A/D) conversion circuit 43. The detection signal amplifying circuit 42 amplifies the output signal Vdet. The A/D conversion circuit 43 converts an analog signal output from the detection signal amplifying circuit 42 into a digital signal. The detection circuit 48 outputs red (R), green (G), and blue (B) color signals for each pixel PX.

The signal processing circuit 44 performs a predetermined adjustment on each of the red (R), green (G), and blue (B) color signals received from the detection circuit 48. For example, the signal processing circuit 44 performs the predetermined adjustment on the color signal so as to reduce variations in the intensity of the light emitted from the first and the second light sources 53 and 54 within the detection area AA and variations in detection sensitivity of the photodiodes PD. The signal processing circuit 44 may acquire the output signals Vdet simultaneously detected by the photodiodes PD and perform a process to average these signals. In this case, the detector 40 can enable stable detection by reducing measurement errors that would be caused by noise and relative positional misalignment between the object to be detected and the sensor 10.

The storage circuit 46 temporarily stores therein the signals calculated by the signal processing circuit 44. The storage circuit 46 may be, for example, a random-access memory (RAM) or a register circuit.

The image processing circuit 49 combines the output signals Vdet output from the respective photodiodes PD of the sensor 10 to generate two-dimensional information on an image. The image processing circuit 49 may output the output signals Vdet as sensor output voltages Vo without calculating the image data. A case may be considered where the detector 40 does not include the image processing circuit 49.

The output processing circuit 50 serves as a processor that performs processing based on the outputs from the photodiodes PD. The output processing circuit 50 may include, for example, the two-dimensional information generated by the image processing circuit 49 in the sensor output voltages Vo. The functions of the output processing circuit 50 may be integrated into another component (for example, the image processing circuit 49).

The following describes a circuit configuration example of the detection device 1. FIG. 3 is a circuit diagram illustrating the detection device. As illustrated in FIG. 3, the sensor 10 includes a plurality of the pixels PX arranged in a matrix having a row-column configuration. Each of the pixels PX is provided with the photodiode PD. The pixels PX including the photodiodes PD are arranged on the substrate 21. The photodiode PD is an organic photodiode (OPD) using an organic semiconductor. A detailed configuration of the pixel PX will be described later with reference to FIG. 4.

Each of the gate lines GCL extends in the first direction Dx and is coupled to the pixels PX arranged in the first direction Dx. A plurality of gate lines GCL(1), GCL(2), . . . , GCL(8) are arranged in the second direction Dy and each coupled to the gate line drive circuit 15. In the following description, the gate lines GCL(1), GCL(2), . . . , GCL(8) will each be simply referred to as the gate line GCL when they need not be distinguished from one another. For ease of understanding of the description, FIG. 3 illustrates eight gate lines GCL. However, this is merely exemplary, and M gate lines GCL may be arranged (where M is 8 or larger, such as 256).

Each of the signal lines SGL extends in the second direction Dy and is coupled to the photodiodes PD of the pixels PX arranged in the second direction Dy. A plurality of signal lines SGL(1), SGL(2), . . . , SGL(12) are arranged in the first direction Dx, and are each coupled to the signal line selection circuit 16 and a reset circuit 17. In the following description, the signal lines SGL(1), SGL(2), . . . , SGL(12) will each be simply referred to as the signal line SGL when they need not be distinguished from one another.

For ease of understanding of the description, 12 of the signal lines SGL are illustrated. However, this is merely exemplary, and N signal lines SGL may be arranged (where N is 12 or larger, such as 252). In FIG. 3, the sensor 10 is provided between the signal line selection circuit 16 and the reset circuit 17. The signal line selection circuit 16 and the reset circuit 17 are not limited to this configuration and may be coupled to ends of the signal lines SGL in the same direction.

The gate line drive circuit 15 receives the various control signals such as the start signal STV, the clock signal CK, and the reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected gate line GCL. This operation supplies the gate drive signal Vgcl to a plurality of transistors Tr (first transistor Tr1 and second transistor Tr2 (refer to FIG. 4)) coupled to the gate line GCL, and the pixels PX arranged in the first direction Dx are selected as detection targets.

The signal line selection circuit 16 includes a plurality of selection signal lines Lsel, a plurality of output signal lines Lout, and a third transistor TrS. A plurality of the third transistors TrS are provided corresponding to the signal lines SGL. Six signal lines SGL(1), SGL(2), . . . , SGL(6) are coupled to a common output signal line Lout1. Six signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third transistors TrS included in one of the signal line blocks. One of the selection signal lines Lsel is coupled to the gates of the third transistors TrS in the signal line blocks.

The control circuit 122 (refer to FIG. 1) sequentially supplies the selection signal ASW to the selection signal lines Lsel. This operation causes the signal line selection circuit 16 to operate the third transistors TrS to sequentially select the signal lines SGL in one of the signal line blocks in a time-division manner. The signal line selection circuit 16 selects one of the signal lines SGL in each of the signal line blocks. The above-described configuration can reduce the number of integrated circuits (ICs) including the detection circuit 48 or the number of terminals of the ICs in the detection device 1. The signal line selection circuit 16 may collectively couple more than one of the signal lines SGL to the detection circuit 48.

As illustrated in FIG. 3, the reset circuit 17 includes a reference signal line Lvr, a reset signal line Lrst, and fourth transistors TrR. The fourth transistors TrR are provided correspondingly to the signal lines SGL. The reference signal line Lvr is coupled to either the sources or the drains of the fourth transistors TrR. The reset signal line Lrst is coupled to the gates of the fourth transistors TrR.

The control circuit 122 supplies a reset signal RST2 to the reset signal line Lrst. This operation turns on the fourth transistors TrR to electrically couple the signal lines SGL to the reference signal line Lvr. The power supply circuit 123 supplies a reference potential COM to the reference signal line Lvr. This operation supplies the reference potential COM to capacitive elements Ca1 and Ca2 (refer to FIG. 4) included in each of the pixels PX.

Figure 4:
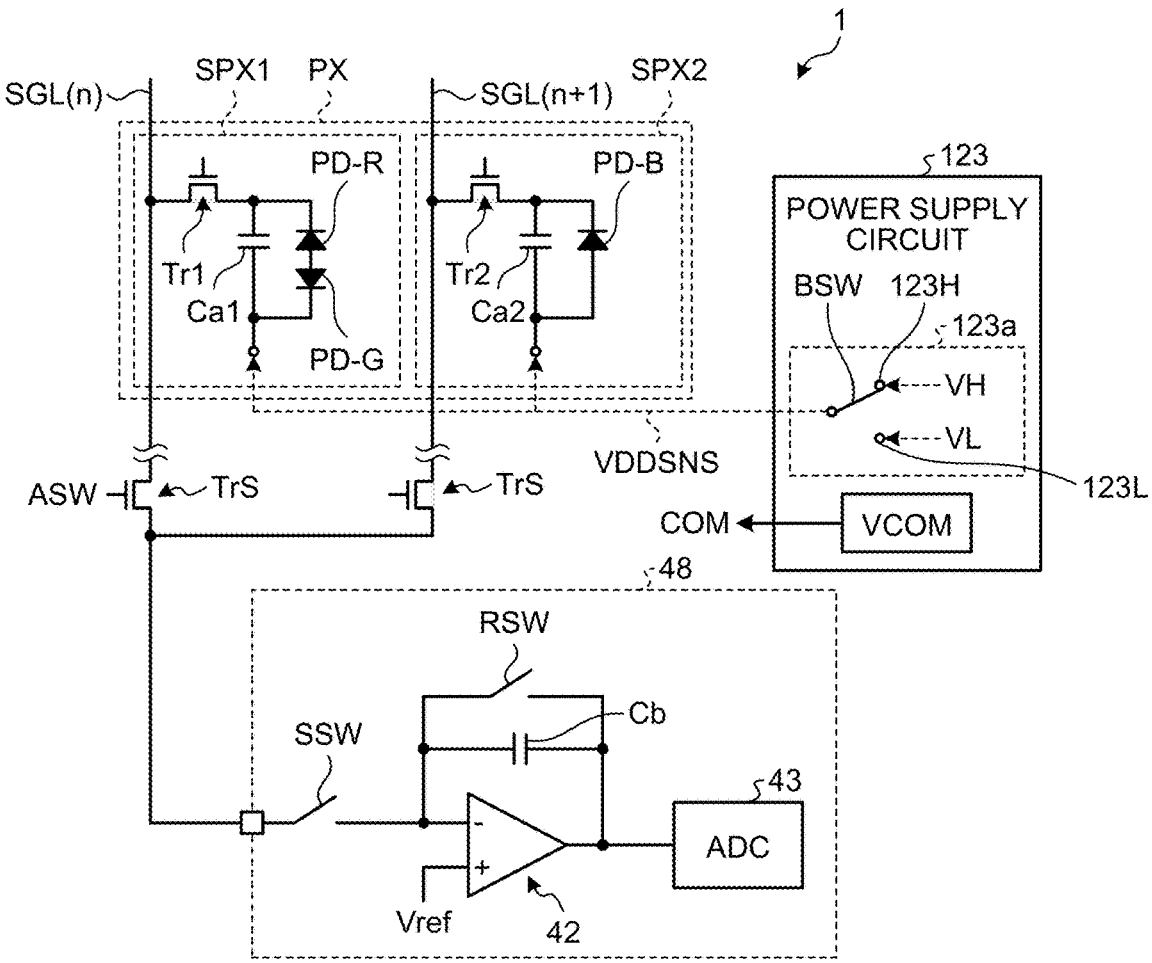
FIG. 4 is a circuit diagram illustrating one pixel and a detection circuit.

FIG. 4 is a circuit diagram illustrating one of the pixels and the detection circuit. FIG. 4 also illustrates a circuit configuration of the power supply circuit 123. As illustrated in FIG. 4, the pixel PX includes a first detection circuit SPX1 and a second detection circuit SPX2. The first detection circuit SPX1 and the second detection circuit SPX2 are sensitive to light in different wavelength regions. Specifically, the first detection circuit SPX1 detects first light that is red (R) light and second light that is green (G) light, out of the light incident on the pixel PX. The second detection circuit SPX2 detects third light that is blue (B) light.

The first detection circuit SPX1 includes a first photodiode PD-R sensitive to the first light, a second photodiode PD-G sensitive to the second light, the capacitive element Ca1, and the first transistor Tr1. The first photodiode PD-R and the second photodiode PD-G are coupled in series and in opposite directions (first detection element). The term "coupled in opposite directions" indicates a coupling configuration in which rectification properties of the first photodiode PD-R and the second photodiode PD-G are in opposite directions.

More specifically, the anode of the first photodiode PD-R is electrically coupled to the anode of the second photodiode PD-G. One end side of the first photodiode PD-R and the second photodiode PD-G coupled in series, that is, the cathode of the first photodiode PD-R, is coupled to a first signal line SGL(n) via the first transistor Tr1. The other end side of the first photodiode PD-R and the second photodiode PD-G coupled in series, that is, the cathode of the second photodiode PD-G, is electrically coupled to a drive signal supply circuit 123a (power supply circuit 123) and supplied with the drive signal VDDSNS (first drive signal).

The capacitive elements Ca1 and Ca2 are a capacitor (sensor capacitor) provided to the photodiodes PD and are equivalently coupled in parallel to the photodiodes PD. In the first detection circuit SPX1, one end side of the capacitive element Ca1 is electrically coupled to the cathode of the first photodiode PD-R, and the other end side of the capacitive element Ca1 is electrically coupled to the cathode of the second photodiode PD-G.

The first transistor Tr1 is provided correspondingly to the photodiodes PD (first photodiode PD-R and second photodiode PD-G). The first transistor Tr1 is made of a thin-film transistor, and in this example, made of an n-channel metal oxide semiconductor (MOS) thin-film transistor (TFT).

The gate of the first transistor Tr1 is coupled to the gate line GCL (refer to FIG. 3). The source of the first transistor Tr1 is coupled to the first signal line SGL(n). The drain of the first transistor Tr1 is coupled to the cathode of the first photodiode PD-R and the one end side of the capacitive element Ca1.

The second detection circuit SPX2 includes a third photodiode PD-B sensitive to the third light, the capacitive element Ca2, and the second transistor Tr2. Unlike the first detection circuit SPX1, the second detection circuit SPX2 is configured with a single third photodiode PD-B. The cathode of the third photodiode PD-B is coupled to a second signal line SGL(n+1) via the second transistor Tr2. The anode of the third photodiode PD-B is electrically coupled to the drive signal supply circuit 123a (power supply circuit 123) and supplied with the drive signal VDDSNS (second drive signal).

In the following description, the first photodiode PD-R, the second photodiode PD-G, and the third photodiode PD-B may each be simply referred to as the photodiode PD when they need not be distinguished from one another. Also, the first signal line SGL(n) and the second signal line SGL(n+1) may each be simply referred to as the signal line SGL when they need not be distinguished from each other.

In the second detection circuit SPX2, one end side of the capacitive element Ca2 is electrically coupled to the cathode of the third photodiode PD-B, and the other end side of the capacitive element Ca2 is electrically coupled to the anode of the third photodiode PD-B.

The second transistor Tr2 is provided correspondingly to the third photodiode PD-B. The second transistor Tr2 is made of a thin-film transistor in the same way as the first transistor Tr1. The gate of the second transistor Tr2 is coupled to the gate line GCL(refer to FIG. 3). The source of the second transistor Tr2 is coupled to the second signal line SGL(n+1). The drain of the second transistor Tr2 is coupled to the cathode of the third photodiode PD-B and the one end side of the capacitive element Ca2.

The reference potential COM (refer to FIG. 3) serving as an initial potential of the signal lines SGL and each of the photodiodes PD is supplied from the power supply circuit 123 to the first signal line SGL(n), the second signal line SGL(n+1), the cathode of the first photodiode PD-R, and the cathode of the third photodiode PD-B. Each of the photodiodes PD is supplied with a bias voltage VB by the drive signal VDDSNS and the reference potential COM. The bias voltage VB is expressed as VB=COM−VDDSNS.

The drive signal supply circuit 123a that supplies the drive signal VDDSNS to each of the photodiodes PD of the first and the second detection circuits SPX1 and SPX2 includes a first voltage signal supply circuit 123H, a second voltage signal supply circuit 123L, and a switch BSW. The first voltage signal supply circuit 123H is a circuit that supplies a first voltage signal VH having a higher-level voltage than the reference potential COM. The second voltage signal supply circuit 123L is a circuit that supplies a second voltage signal VL having a lower-level voltage than the reference potential COM. The switch BSW is a switch element that switches the coupling state of the first voltage signal supply circuit 123H and the second voltage signal supply circuit 123L to the photodiodes PD of the first and the second detection circuits SPX1 and SPX2. By operating the switch BSW, the drive signal supply circuit 123a supplies the first voltage signal VH or the second voltage signal VL to each of the photodiodes PD of the first and the second detection circuits SPX1 and SPX2 in a time-division manner. When the second photodiode PD-G is forward biased, the path from the second signal line SGL(n+1) is preferably brought into a high-impedance state, for example, by making the second transistor Tr2 gated off, or turning off the third transistor TrS coupled to the path.

Specifically, when the first voltage signal VH (VH>COM) is supplied from the drive signal supply circuit 123a to the cathode of the second photodiode PD-G in the first detection circuit SPX1, the first photodiode PD-R is driven in a forward biased state and the second photodiode PD-G is driven in a reverse biased state. In this case, the second photodiode PD-G detects the second light (G), and a forward current flows through the first photodiode PD-R. In other words, the first photodiode PD-R is refreshed in synchronization with a detection period during which the second photodiode PD-G performs detection. In the present disclosure, the term "refresh operation" refers to an operation to return the characteristics of the OPD to an initial state by causing a forward bias current to flow through the photodiode PD.

When the second voltage signal VL (VL<COM) is supplied from the drive signal supply circuit 123a to the cathode of the second photodiode PD-G, the first photodiode PD-R is driven in the reverse biased state and the second photodiode PD-G is driven in the forward biased state. In this case, the first photodiode PD-R detects the first light (R), and the second photodiode PD-G allows a forward current to flow therethrough and is refreshed.

When the first voltage signal VH (VH>COM) is supplied from the drive signal supply circuit 123a to the anode of the third photodiode PD-B in the second detection circuit SPX2, for example, the second transistor Tr2 is gated off, and the third photodiode PD-B is not driven in the forward biased state, thus no refresh being performed. When the second voltage signal VL (VL<COM) is supplied from the drive signal supply circuit 123a to the anode of the third photodiode PD-B, the third photodiode PD-B is driven in the reverse biased state, and the third light (B) is detected.

The detection device 1 performs the detection of the first light (R) by the first photodiode PD-R and the second light (G) by the second photodiode PD-G in the first detection circuit SPX1 in a time-division manner. The detection device 1 may perform the detection of the third light (B) by the third photodiode PD-B in the second detection circuit SPX2 in synchronization with the detection in the first detection circuit SPX1, or in a time-division manner without synchronizing with the detection in the first detection circuit SPX1.

In other words, as the drive signal VDDSNS (first drive signal) supplied to the first detection circuit SPX1 and the drive signal VDDSNS (second drive signal) supplied to the second detection circuit SPX2, signals having the same potential may be synchronously supplied, or different signals may be supplied to these detection circuits. When the second photodiode PD-G is forward biased, the path from the second signal line SGL(n+1) is preferably brought into a high-impedance state by, for example, making the second transistor Tr2 gated off or turning off the third transistor TrS that is coupled to the path.

When the first and the second detection circuits SPX1 and SPX2 are irradiated with light, currents corresponding to amounts of light of the first light, the second light, and the third light flow through the photodiodes PD (the first photodiode PD-R, the second photodiode PD-G, and the third photodiode PD-B), thereby storing an electric charge in the capacitive elements Ca1 and Ca2. When the first transistor Tr1 or the second transistor Tr2 is turned on, a current flows in the signal line SGL according to the electric charge stored in the capacitive element Ca1 or Ca2. The signal line SGL is electrically coupled to the detection circuit 48 via the third transistor TrS of the signal line selection circuit 16. This configuration allows the detection device 1 to detect, for each of the pixels PX, a signal corresponding to an amount of light with which each of the photodiodes PD is irradiated.

During a read period, a switch SSW is tuned on to couple the detection circuit 48 to the signal line SGL. The detection signal amplifying circuit 42 of the detection circuit 48 converts a current supplied from the signal line SGL into a voltage corresponding to the value of the current and amplifies the voltage. A reference potential (Vref) having a fixed potential is supplied to a non-inverting input portion (+) of the detection signal amplifying circuit 42, and the signal line SGL is coupled to an inverting input portion (−) of the detection signal amplifying circuit 42. In the present embodiment, the same signal as the reference potential COM is supplied as the reference potential (Vref) voltage. The signal processing circuit 44 (refer to FIG. 2) calculates the difference between the output signal Vdet obtained when light is emitted and the output signal Vdet obtained when light is not emitted, as each of the sensor output voltages Vo. The detection signal amplifying circuit 42 includes a capacitive element Cb and a reset switch RSW. During a reset period, the reset switch RSW is turned on, and the electric charge of the capacitive element Cb is reset.

Figure 5:
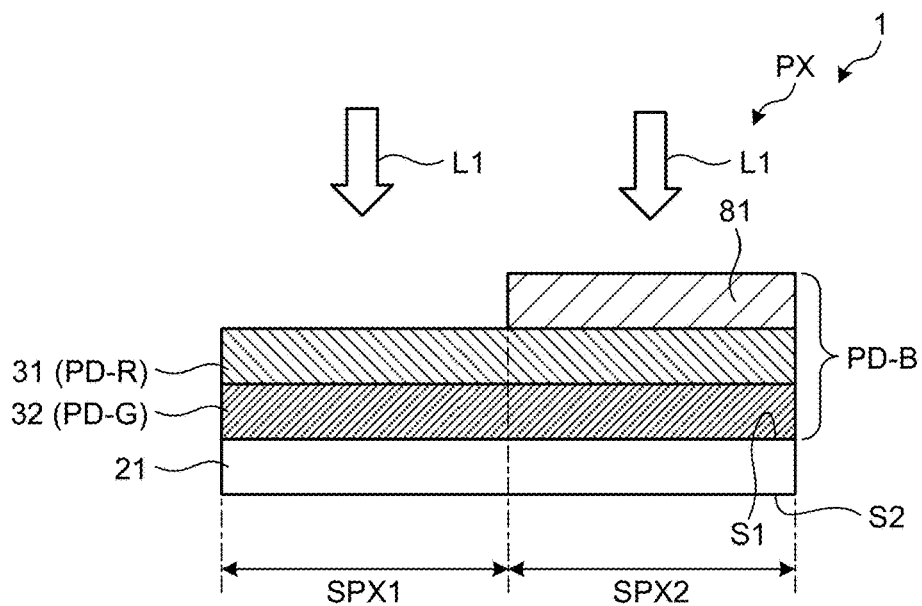
FIG. 5 is a sectional view schematically illustrating a section of the detection device according to the first embodiment.

The following describes a configuration example of the photodiode PD. FIG. 5 is a sectional view schematically illustrating a section of the detection device according to the first embodiment. As illustrated in FIG. 5, the first photodiode PD-R, the second photodiode PD-G, and the third photodiode PD-B are provided on a first principal surface S1 of the substrate 21. The detection device 1 according to the first embodiment is a top-surface light receiving optical sensor, and light L1 is incident from the first principal surface S1 side of the substrate 21.

The substrate 21 is an insulating base member, and is made using, for example, glass or a resin material. The substrate 21 is a flat plate-shaped member having the first principal surface S1 and a second principal surface S2 opposite to the first principal surface S1. The substrate 21 is, however, not limited to having a flat plate shape but may have a curved surface. In this case, the substrate 21 may be a film-like resin.

The first photodiode PD-R is configured with a first organic semiconductor layer 31 that is sensitive to the first light. The second photodiode PD-G is configured with a second organic semiconductor layer 32 that is sensitive to the second light. The second organic semiconductor layer 32 (second photodiode PD-G) and the first organic semiconductor layer 31 (first photodiode PD-R) are stacked in this order on the first principal surface S1 of the substrate 21 in an area overlapping the first detection circuit SPX1. However, the stacking order of the second organic semiconductor layer 32 (second photodiode PD-G) and the first organic semiconductor layer 31 (first photodiode PD-R) may be reversed.

The third photodiode PD-B includes a multilayered structure in which the first organic semiconductor layer 31 and the second organic semiconductor layer 32 are stacked. The second organic semiconductor layer 32, the first organic semiconductor layer 31, and a wavelength conversion layer 81 are stacked in this order on the first principal surface S1 of the substrate 21 in an area overlapping the second detection circuit SPX2. The wavelength conversion layer 81 is stacked on a surface side of the second and the first organic semiconductor layers 32 and 31 on which the light L1 is incident (on the upper surface of the first organic semiconductor layer 31 in FIG. 5). In other words, the second detection circuit SPX2 includes the third photodiode PD-B and the wavelength conversion layer 81 that converts the third light into the first light or the second light.

The first organic semiconductor layer 31 and the second organic semiconductor layer 32 are provided continuously from the area overlapping the first detection circuit SPX1 to the area overlapping the second detection circuit SPX2. That is, the first organic semiconductor layer 31 forming the first photodiode PD-R and the first organic semiconductor layer 31 forming the third photodiode PD-B are continuously formed in the same layer, and the second organic semiconductor layer 32 forming the second photodiode PD-G and the second organic semiconductor layer 32 forming the third photodiode PD-B are continuously formed in the same layer.

A wavelength conversion film, a wavelength cut film that cuts off specific wavelength components and transmits other wavelength components, or the like can be used as the wavelength conversion layer 81. For example, the wavelength conversion layer 81 converts the third light (B) component of the light L1 into the first light (R).

With such a configuration, the first photodiode PD-R of the first detection circuit SPX1 outputs the output signal Vdet (R) based on the first light (R) of the light L1. The second light (G) component of the light L1 is not absorbed by the first organic semiconductor layer 31 (first photodiode PD-R) and enters the second organic semiconductor layer 32 (second photodiode PD-G). The second photodiode PD-G of the first detection circuit SPX1 outputs the output signal Vdet (G) based on the second light (G) of the light L1.

The first organic semiconductor layer 31 (third photodiode PD-B) of the second detection circuit SPX2 outputs the output signal Vdet (B) based on light of the light L1 that has been converted from the third light (B) into the first light (R) by the wavelength conversion layer 81.

The signal processing circuit 44 (refer to FIG. 2) performs arithmetic processing on each of the output signals Vdet from the first photodiode PD-R, the second photodiode PD-G, and the third photodiode PD-B as needed. For example, in the second detection circuit SPX2, a detection value of the second detection circuit SPX2 can be obtained by subtracting an output value of the output signal Vdet (R) of the first detection circuit SPX1 from an output value of the output signal Vdet (B) from the third photodiode PD-B according to transmission characteristics of the wavelength conversion layer 81.

Such a configuration allows the detection device 1 to detect the first light (R), the second light (G), and the third light (B) using the first photodiode PD-R, the second photodiode PD-G, and the third photodiode PD-B, respectively. The first photodiode PD-R and the second photodiode PD-G are formed of the first and the second organic semiconductor layers 31 and 32 stacked on the substrate 21, and configured as one first detection circuit SPX1. In other words, one first detection circuit SPX1 is sensitive to each of the first light (R) and the second light (G). The second detection circuit SPX2 is sensitive to the third light (B). While conventionally three detection elements having different sensitivities to red, green, and blue (RGB) are required to detect a color image, the detection device 1 of the present embodiment can detect the first light (R), the second light (G), and the third light (B) using the two first and second detection circuits SPX1 and SPX2.

Second Embodiment

Figure 6:
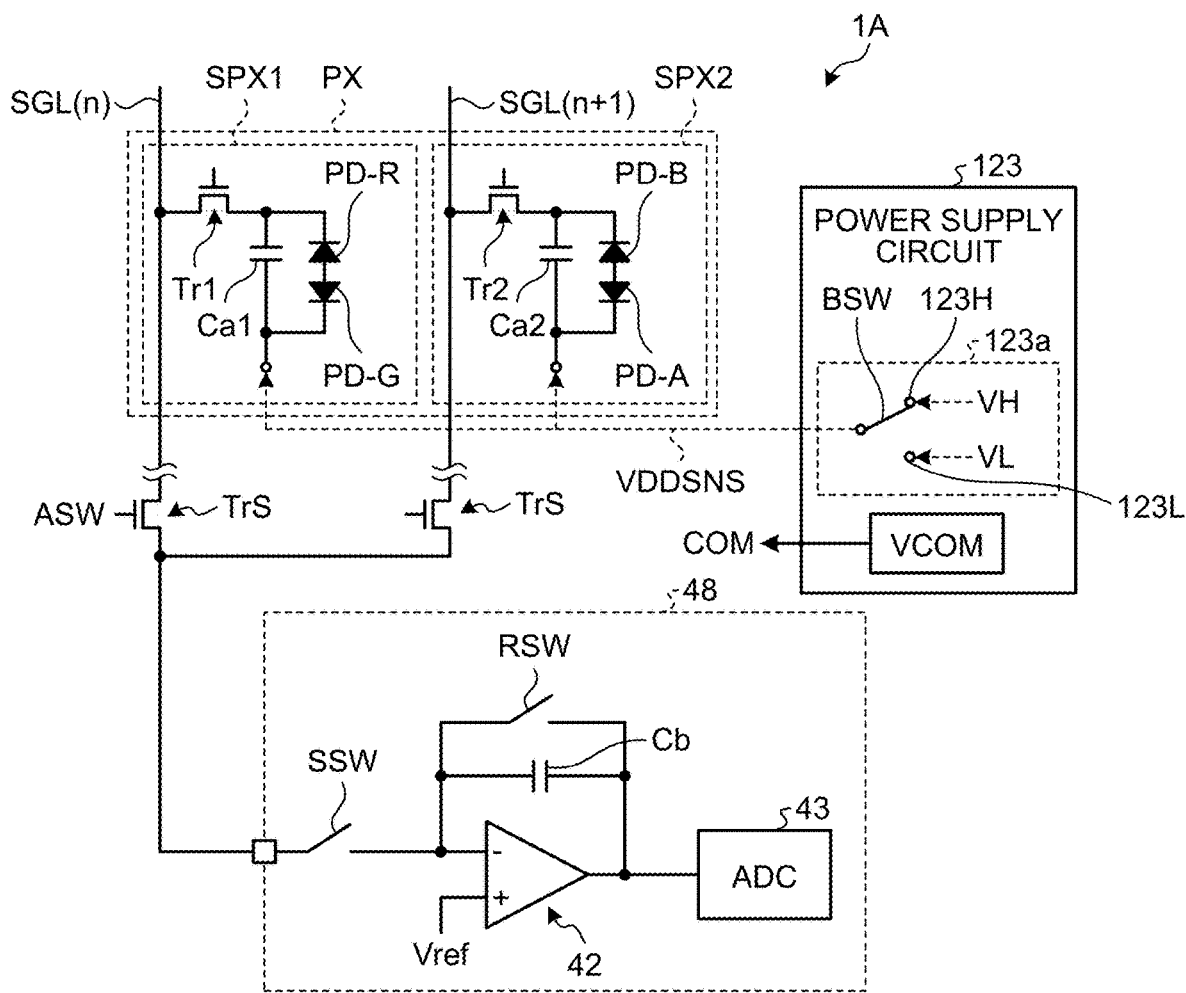
FIG. 6 is a circuit diagram illustrating one pixel and the detection circuit of a detection device according to a second embodiment.

FIG. 6 is a circuit diagram illustrating one pixel and the detection circuit of a detection device according to a second embodiment. In the following description, the same components as those described in the embodiment above are denoted by the same reference numerals, and the description thereof will not be repeated.

As illustrated in FIG. 6, in a detection device 1A according to the second embodiment, the second detection circuit SPX2 includes the third photodiode PD-B and a fourth photodiode PD-A. The fourth photodiode PD-A is sensitive to light other than the first light (R), the second light (G), and the third light (B) (for example, near-infrared light). The third photodiode PD-B and the fourth photodiode PD-A are coupled in series and in opposite directions. The coupling configuration between the third photodiode PD-B and the fourth photodiode PD-A is the same as that of the first detection circuit SPX1 described above, and will not be described again.

In the present embodiment, the wavelength conversion layer 81 (refer to FIG. 5) has, for example, a function to convert the near-infrared component into the second light (G), in addition to the function to convert the third light (B) component of the light L1 into the first light (R). This function allows the second organic semiconductor layer 32 of the second detection circuit SPX2 illustrated in FIG. 5 to serve as the fourth photodiode PD-A and detect the near-infrared component. That is, the second organic semiconductor layer 32 forming the second photodiode PD-G and the second organic semiconductor layer 32 forming the fourth photodiode PD-A are continuously formed in the same layer.

Third Embodiment

Figure 7:
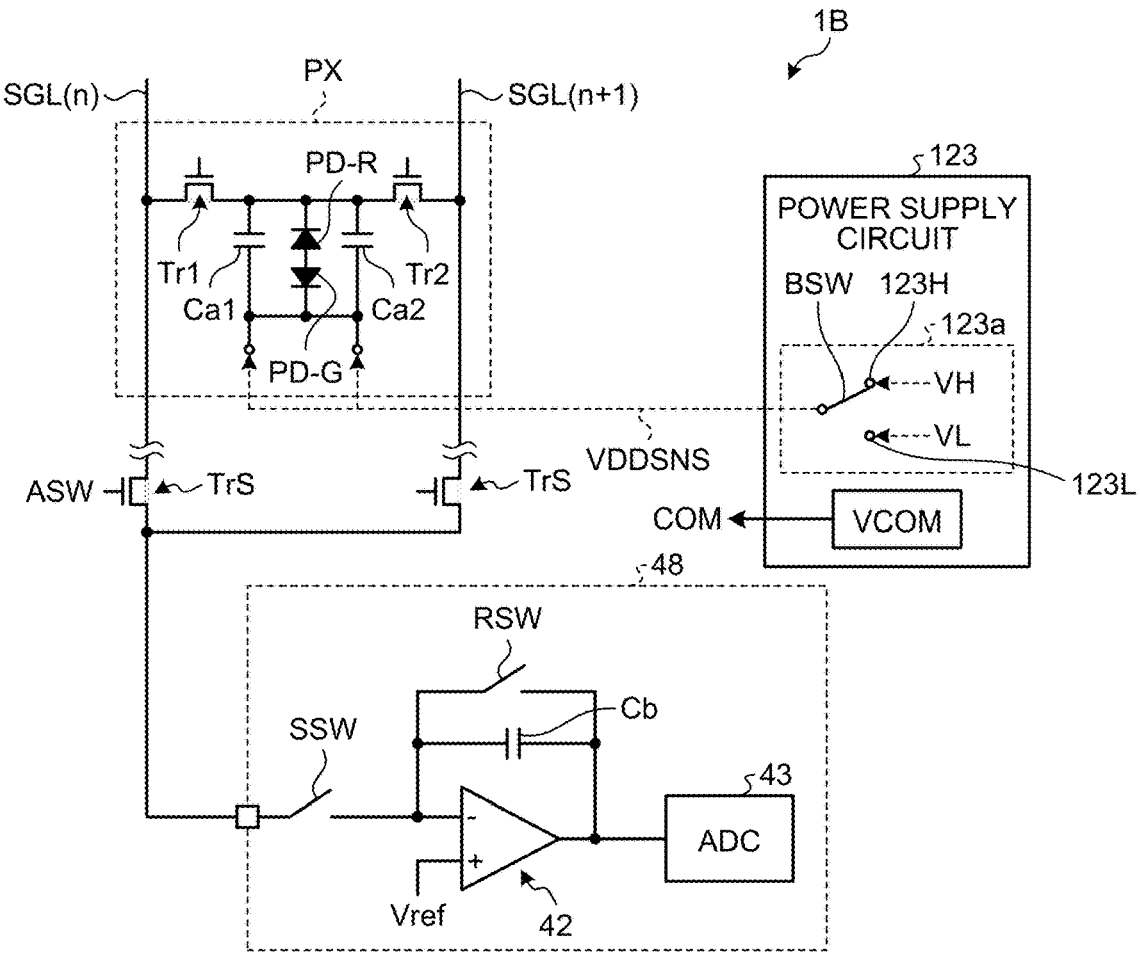
FIG. 7 is a circuit diagram illustrating one pixel and the detection circuit of a detection device according to a third embodiment.

FIG. 7 is a circuit diagram illustrating one pixel and the detection circuit of a detection device according to a third embodiment. As illustrated in FIG. 7, in a detection device 1B according to the third embodiment, the pixel PX includes the first photodiode PD-R, the second photodiode PD-G, the two capacitive elements Ca1 and Ca2, the first transistor Tr1, and the second transistor Tr2.

The cathode of the first photodiode PD-R is coupled to the first signal line SGL(n) via the first transistor Tr1 and to the second signal line SGL(n+1) via the second transistor Tr2. The drive signal VDDSNS is supplied from the drive signal supply circuit 123a to the cathode of the second photodiode PD-G.

In the present embodiment, one of the first photodiode PD-R and the second photodiode PD-G also serves as the third photodiode PD-B. For example, when the first transistor Tr1 is on and the second transistor Tr2 is off, the first photodiode PD-R detects the first light (R) and the second photodiode PD-G detects the second light (G). When the first transistor Tr1 is off and the second transistor Tr2 is on, one of the first photodiode PD-R and the second photodiode PD-G detects the third light (B).

In the present embodiment, the number of the photodiodes PD included in one pixel PX can be made smaller than in the embodiments described above. Such a configuration allows conventional protocols to be used as they are.

Fourth Embodiment

Figure 8:
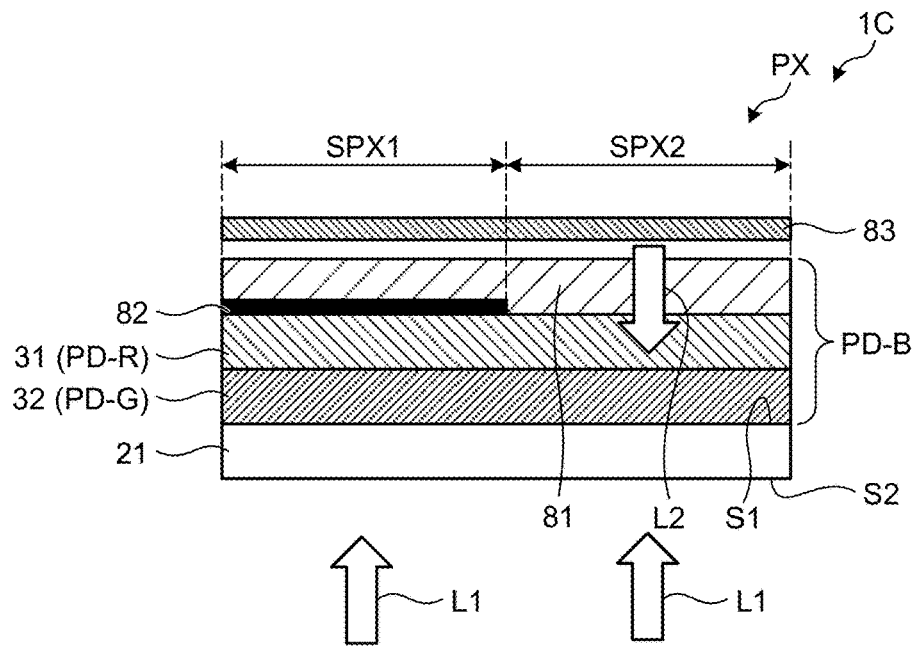
FIG. 8 is a sectional view schematically illustrating a section of a detection device according to a fourth embodiment.

FIG. 8 is a sectional view schematically illustrating a section of a detection device according to a fourth embodiment. As illustrated in FIG. 8, a detection device 1C according to the fourth embodiment further includes a light-blocking layer 82 and a reflective layer 83. The detection device 1C according to the fourth embodiment is a bottom-surface light receiving optical sensor, and the light L1 is incident from the second principal surface S2 side of the substrate 21. In the present embodiment, the light-blocking layer 82, the wavelength conversion layer 81, and the reflective layer 83 are provided on a surface of the first and the second organic semiconductor layers 31 and 32 opposite to the plane of incidence of the light L1 (on the upper surface of the first organic semiconductor layer 31 in FIG. 8).

More specifically, the second and the first organic semiconductor layers 32 and 31 are stacked in this order on the first principal surface S1 of the substrate 21. However, the stacking order of the second and the first organic semiconductor layers 32 and 31 may be reversed.

The wavelength conversion layer 81 and the reflective layer 83 are provided in this order on the upper surface of the first organic semiconductor layer 31 (on the surface opposite to the plane of incidence of the light L1). The wavelength conversion layer 81 and the reflective layer 83 are provided continuously across the first and second detection circuits SPX1 and SPX2. The light-blocking layer 82 is provided between the first organic semiconductor layer 31 and the wavelength conversion layer 81 in the area overlapping the first detection circuit SPX1. The light-blocking layer 82 is not provided in the area overlapping the second detection circuit SPX2.

In other words, the second organic semiconductor layer 32 (second photodiode PD-G), the first organic semiconductor layer 31 (first photodiode PD-R), the light-blocking layer 82, the wavelength conversion layer 81, and the reflective layer 83 are stacked in this order on the first principal surface S1 of the substrate 21 in the area overlapping the first detection circuit SPX1. The second and the first organic semiconductor layers 32 and 31 (third photodiode PD-B), the wavelength conversion layer 81, and the reflective layer 83 are stacked in this order on the first principal surface S1 of the substrate 21 in the area overlapping the second detection circuit SPX2.

In the first detection circuit SPX1, the first photodiode PD-R detects the first light (R) component of the light L1, and the second photodiode PD-G detects the second light (G) component of the light L1. In the area overlapping the first detection circuit SPX1, the light L1 transmitted through the first photodiode PD-R and the second photodiode PD-G is blocked by the light-blocking layer 82 and restrained from traveling to the wavelength conversion layer 81.

In the second detection circuit SPX2, a component of the light L1 transmitted through the second and the first organic semiconductor layers 32 and 31 (third photodiode PD-B) enters the wavelength conversion layer 81. Reflected light L2 transmitted through the wavelength conversion layer 81 and reflected by the reflective layer 83 passes through the wavelength conversion layer 81 again and enters the second and the first organic semiconductor layers 32 and 31. The wavelength conversion layer 81 converts the third light (B) component of the light L1 into the first light (R), in the same way as in the first embodiment. As a result, the first organic semiconductor layer 31 included in the third photodiode PD-B of the second detection circuit SPX2 outputs the output signal Vdet (B) based on light of the reflected light L2 that has been converted from the third light (B) into the first light (R) by the wavelength conversion layer 81.

Also in the present embodiment, the first organic semiconductor layer 31 included in the third photodiode PD-B of the second detection circuit SPX2 also detects the light L1 incident from the second principal surface S2 side. Therefore, in the same way as in the first embodiment described above, the signal processing circuit 44 (refer to FIG. 2) calculates the detection value of the second detection circuit SPX2 by performing a predetermined arithmetic process. That is, in the case where the wavelength conversion layer 81 converts the third light (B) into the first light (R), for example, the detection value of the second detection circuit SPX2 can be obtained by subtracting the output value of the output signal Vdet (R) of the first organic semiconductor layer 31 in the first detection circuit SPX1 from the output value of the output signal Vdet (B) from the first organic semiconductor layer 31 (third photodiode PD-B) in the second detection circuit SPX2. In the case where the wavelength conversion layer 81 converts the third light (B) into the second light (G), for example, in the same way as described above, the detection value of the second detection circuit SPX2 can be obtained by subtracting the output value of the output signal Vdet (G) of the second organic semiconductor layer 32 in the first detection circuit SPX1 from the output value of the output signal Vdet (G) from the second organic semiconductor layer 32 (third photodiode PD-B) in the second detection circuit SPX2. The same applies to examples to be described with reference to FIGS. 9 and 11, and repeated description will be omitted.

Fifth Embodiment

Figure 9:
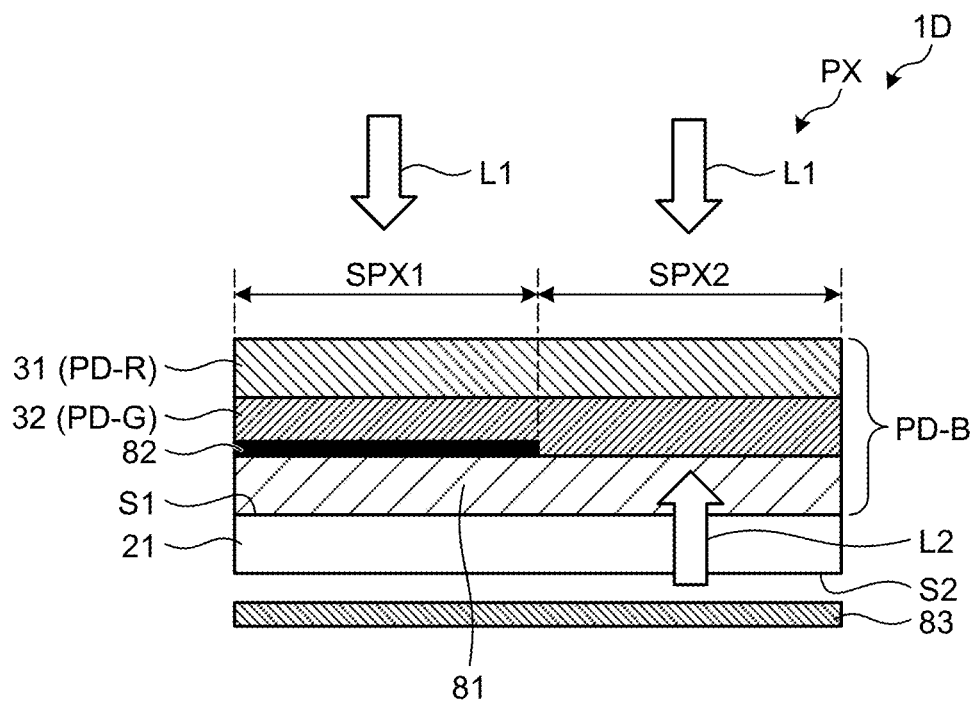
FIG. 9 is a sectional view schematically illustrating a section of a detection device according to a fifth embodiment.

FIG. 9 is a sectional view schematically illustrating a section of a detection device according to a fifth embodiment. As illustrated in FIG. 9, a detection device 1D according to the fifth embodiment is a top-surface light receiving optical sensor, and the light L1 is incident from the first principal surface S1 side of the substrate 21. In the detection device 1D of the fifth embodiment, the wavelength conversion layer 81, the light-blocking layer 82, the second organic semiconductor layer 32, and the first organic semiconductor layer 31 are stacked in this order on the first principal surface S1 of the substrate 21.

The wavelength conversion layer 81, the second organic semiconductor layer 32, and the first organic semiconductor layer 31 are provided continuously across the first and the second detection circuits SPX1 and SPX2. The light-blocking layer 82 is provided between the first organic semiconductor layer 31 and the wavelength conversion layer 81 in the area overlapping the first detection circuit SPX1. The light-blocking layer 82 is not provided in the area overlapping the second detection circuit SPX2.

The reflective layer 83 is disposed so as to face the second principal surface S2 of the substrate 21. The reflective layer 83 is provided continuously across the first and the second detection circuits SPX1 and SPX2.

The light-blocking layer 82, the wavelength conversion layer 81, and the reflective layer 83 are arranged on the opposite side to the surface side of the first and the second organic semiconductor layers 31 and 32 on which the light L1 is incident. That is, when viewed from the surface side on which the light L1 is incident, the arrangement relation between the group of the light-blocking layer 82, the wavelength conversion layer 81, and the reflective layer 83 and the group of the first and the second organic semiconductor layers 31 and 32 is the same as that in the fourth embodiment described above. The detection of the light L1 and the reflected light L2 by the first and the second detection circuits SPX1 and SPX2 is the same as that in the fourth embodiment described above, and will not be described again.

Sixth Embodiment

Figure 10:
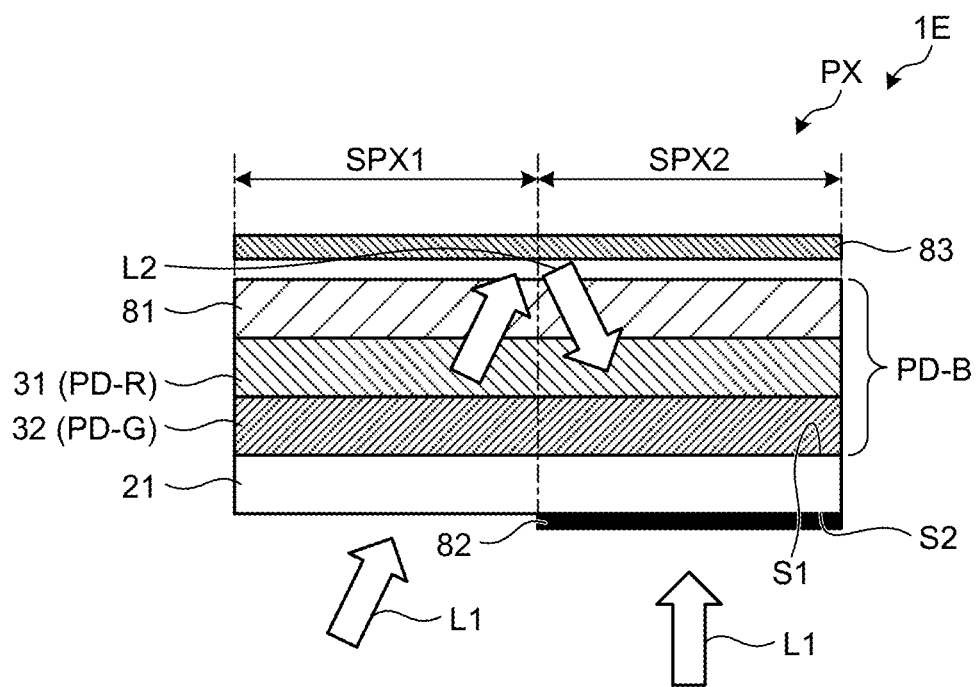
FIG. 10 is a sectional view schematically illustrating a section of a detection device according to a sixth embodiment.

FIG. 10 is a sectional view schematically illustrating a section of a detection device according to a sixth embodiment. As illustrated in FIG. 10, a detection device 1E according to the sixth embodiment is a bottom-surface light receiving optical sensor, and the light L1 is incident from the second principal surface S2 side of the substrate 21. The wavelength conversion layer 81 and the reflective layer 83 are provided in this order on a surface opposite to a light incidence surface of the first and the second organic semiconductor layers 31 and 32 (on the upper surface of the first organic semiconductor layer 31). The light-blocking layer 82 is provided on a light incidence surface side of the first and the second organic semiconductor layers 31 and 32 (on the lower surface side of the second organic semiconductor layer 32) in the area overlapping the second detection circuit SPX2.

In more detail, the second organic semiconductor layer 32, the first organic semiconductor layer 31, the wavelength conversion layer 81, and the reflective layer 83 are stacked in this order on the first principal surface S1 of the substrate 21. The second organic semiconductor layer 32, the first organic semiconductor layer 31, the wavelength conversion layer 81, and the reflective layer 83 are continuously provided across the first and the second detection circuits SPX1 and SPX2. The light-blocking layer 82 is provided on the second principal surface S2 of the substrate 21 in the area overlapping the second detection circuit SPX2 and is not provided in the area overlapping the first detection circuit SPX1.

The detection device 1E is a bottom-surface light receiving optical sensor as described above, and in the second detection circuit SPX2, the light-blocking layer 82 reduces the light L1 incident from the second principal surface S2 side of the substrate 21. The second detection circuit SPX2 detects the light L1 obliquely incident on the first detection circuit SPX1.

More specifically, in the first detection circuit SPX1, the first photodiode PD-R detects the first light (R) component of the light L1, and the second photodiode PD-G detects the second light (G) component of the light L1. The light L1 transmitted through the first photodiode PD-R (first organic semiconductor layer 31) and the second photodiode PD-G (second organic semiconductor layer 32) of the first detection circuit SPX1 enters the wavelength conversion layer 81. The reflected light L2 transmitted through the wavelength conversion layer 81 and reflected by the reflective layer 83 passes through the wavelength conversion layer 81 again and enters the second and the first organic semiconductor layers 32 and 31 on the second detection circuit SPX2 side.

The wavelength conversion layer 81 converts the third light (B) component of the light L1 into the first light (R), in the same way as in the first embodiment. As a result, the first organic semiconductor layer 31 (third photodiode PD-B) of the second detection circuit SPX2 outputs the output signal Vdet (B) based on the light of the reflected light L2 that has been converted from the third light (B) into the first light (R) by the wavelength conversion layer 81.

In the present embodiment, since the light-blocking layer 82 is provided, the first light (R) component of the light L1 incident on the first organic semiconductor layer 31 (third photodiode PD-B) of the second detection circuit SPX2 from the second principal surface S2 side is reduced. Therefore, the reflected light L2 transmitted through the first detection circuit SPX1 and reflected by the reflective layer 83 enters the third photodiode PD-B, and the light converted from the third light (B) into the first light (R) by the wavelength conversion layer 81 can be detected well. In this example, no subtraction processing is required.

Seventh Embodiment

Figure 11:
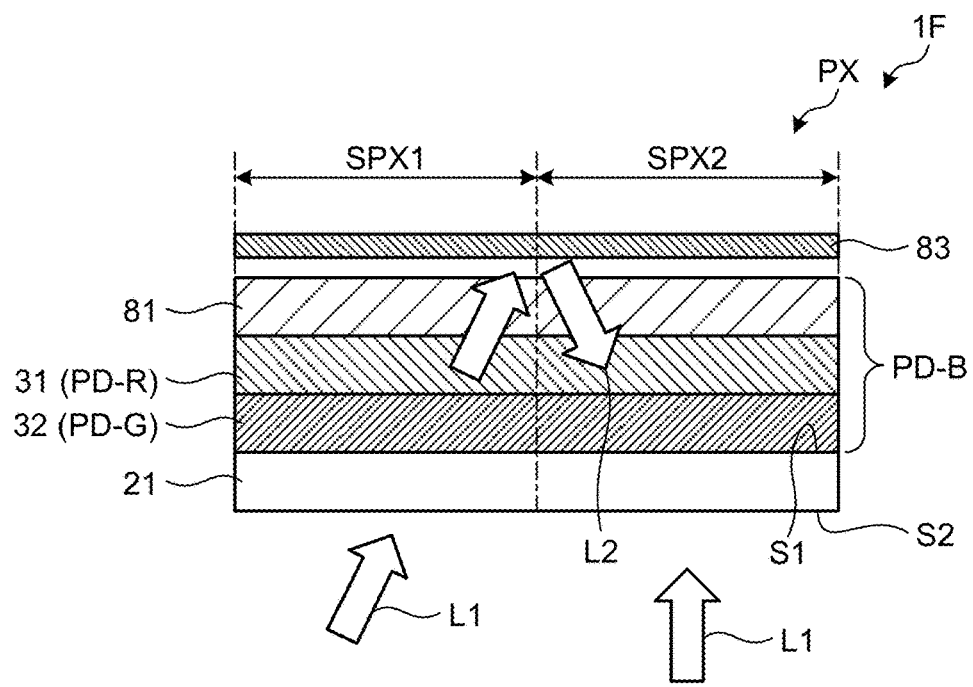
FIG. 11 is a sectional view schematically illustrating a section of a detection device according to a seventh embodiment.

FIG. 11 is a sectional view schematically illustrating a section of a detection device according to a seventh embodiment. As illustrated in FIG. 11, a detection device 1F according to the seventh embodiment differs from the detection device 1E of the sixth embodiment described above in configuration in that the light-blocking layer 82 is not provided. That is, the second organic semiconductor layer 32, the first organic semiconductor layer 31, the wavelength conversion layer 81, and the reflective layer 83 are stacked in this order on the first principal surface S1 of the substrate 21. The light-blocking layer 82 is not provided on the second principal surface S2 of the substrate 21.

The reflected light L2 reflected by the reflective layer 83 and the light L1 incident from the second principal surface S2 side enter the first organic semiconductor layer 31 (third photodiode PD-B) of the second detection circuit SPX2. Even in this case, in the same way as in the first embodiment described above, the signal processing circuit 44 (refer to FIG. 2) can calculate the detection value of the second detection circuit SPX2 by performing the predetermined arithmetic process.

Electronic Apparatus

Figure 12:
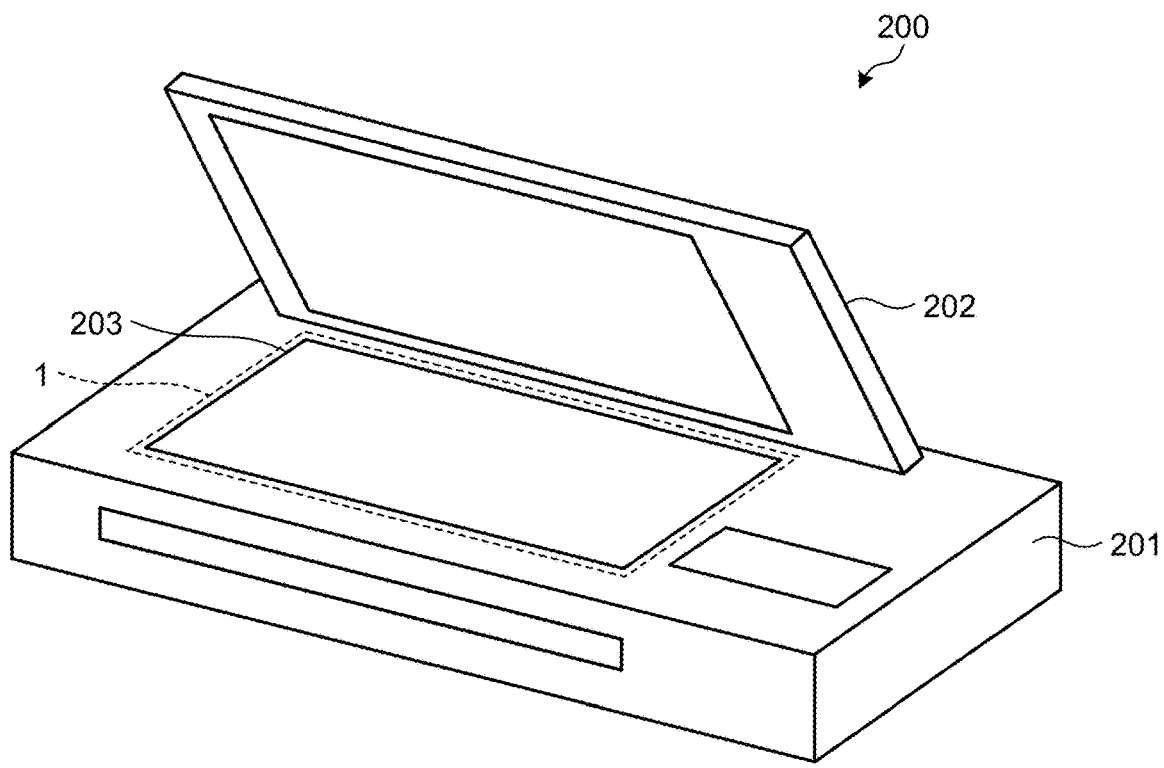
FIG. 12 is a view illustrating an example of an electronic apparatus to which the detection device is applied.

FIG. 12 is a view illustrating an example of an electronic apparatus to which the detection device is applied. As illustrated in FIG. 12, a color scanner 200 to which the detection device 1 is applied includes, for example, a body 201 and a cover 202. The detection device 1 is mounted inside the body 201 and can image the object to be detected placed in a detection area 203. The color scanner 200 is not limited to the detection device 1, and any one of the detection devices 1A to 1F may be provided. The detection device 1 and the detection devices 1A to 1F described above may be applied to other electronic apparatuses such as a digital camera, without being limited to the color scanner 200.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and modifications of the components can be made without departing from the gist of the embodiments and modifications described above.

What is claimed is:

1. A detection device comprising:
   a first detection circuit comprising a first photodiode sensitive to first light and a second photodiode sensitive to second light; and
   a second detection circuit comprising a third photodiode sensitive to third light,
   wherein
   the first photodiode and the second photodiode are coupled in series and in
   opposite directions to form a first detection element,
   one end side of the first detection element is coupled to a first signal line via a first transistor,
   another end side of the first detection element is configured to be supplied with a first drive signal,
   a cathode of the third photodiode is coupled to a second signal line via a second transistor, and
   an anode of the third photodiode is configured to be supplied with a second drive signal,
   wherein
   the first photodiode comprises a first organic semiconductor layer sensitive to the first light,
   the second photodiode comprises a second organic semiconductor layer sensitive to the second light,
   the third photodiode comprises a multilayered structure in which the first organic semiconductor layer and the second organic semiconductor layer are stacked, and
   the second detection circuit comprises the third photodiode and a wavelength conversion layer that is configured to convert the third light into the first light or the second light.

2. The detection device according to claim 1, wherein
   the first organic semiconductor layer that forms the first photodiode and the first organic semiconductor layer that forms the third photodiode are continuously formed in a same layer, and
   the second organic semiconductor layer that forms the second photodiode and the second organic semiconductor layer that forms the third photodiode are continuously formed in a same layer.

3. The detection device according to claim 1, comprising:
a reflective layer that faces the wavelength conversion layer; and
a light-blocking layer, wherein
the wavelength conversion layer and the reflective layer are provided, in the order as listed, on a surface opposite to a light incidence surface of the first organic semiconductor layer and the second organic semiconductor layer, and
the light-blocking layer is provided between the wavelength conversion layer and the first and the second organic semiconductor layers in an area overlapping the first detection circuit.

4. The detection device according to claim 1, comprising:
a reflective layer that faces the wavelength conversion layer; and
a light-blocking layer, wherein
the wavelength conversion layer and the reflective layer are provided, in the order as listed, on a surface opposite to a light incidence surface of the first organic semiconductor layer and the second organic semiconductor layer, and
the light-blocking layer is provided on the light incidence surface side of the first organic semiconductor layer and the second organic semiconductor layer in an area overlapping the second detection circuit.

5. The detection device according to claim 1, comprising a signal processing circuit configured to receive output signals from the first detection circuit and the second detection circuit and process the signals, wherein
the signal processing circuit is configured to calculate a detection value of the second detection circuit by subtracting an output value of the output signal of the first detection circuit from an output value of the output signal of the second detection circuit.

6. The detection device according to claim 1, wherein
the first light is red light,
the second light is green light, and
the third light is blue light.

* * * * *